United States Patent [19]
White

[11] Patent Number: 5,828,232
[45] Date of Patent: Oct. 27, 1998

[54] CIRCUIT TO REDUCE CURRENT AND VOLTAGE SPIKES WHEN SWITCHING INDUCTIVE LOADS

[75] Inventor: Bert White, Irvine, Calif.

[73] Assignee: Texas Instruments Incorporated, Dallas, Tex.

[21] Appl. No.: 966,594

[22] Filed: Nov. 10, 1997

Related U.S. Application Data

[63] Continuation of Ser. No. 558,397, Nov. 16, 1995, abandoned.

[51] Int. Cl.$^6$ .................................................... H03K 17/16
[52] U.S. Cl. ................................................ 326/83; 326/27
[58] Field of Search ................................ 326/82, 83, 26, 326/27; 327/108, 110

[56] References Cited

U.S. PATENT DOCUMENTS

| | | | |
|---|---|---|---|
| 4,667,144 | 5/1987 | Jones et al. ............................. | 327/110 |
| 5,233,238 | 8/1993 | Mattos ..................................... | 326/83 |
| 5,235,219 | 8/1993 | Cooperman et al. ..................... | 326/83 |
| 5,412,259 | 5/1995 | Tokumaru et al. ....................... | 326/83 |
| 5,438,290 | 8/1995 | Tanaka .................................... | 327/110 |

*Primary Examiner*—Michael J. Tokar
*Assistant Examiner*—Richard Roseen
*Attorney, Agent, or Firm*—W. Daniel Swayze, Jr.; Wade James Brady, III; Richard L. Donaldson

[57] ABSTRACT

The present invention discloses a circuit to reduce current and voltage spikes when switching inductive loads. The circuit of the present invention achieves this reduction in voltage and current spikes without requiring the prior art's large sizes for the transistors driving the inductive load. The invention results in reduced cost and power consumption. Moreover, the invention's circuit maintains a fast switching time for the transistors driving the inductive load. The invention's circuit comprises a current steering mechanism which directs current to one of the two drivers driving an inductive load. According to the invention, current is directed to the driver coupled to the supply voltage, the driver coupled to ground, or both in different amounts. The current is directed to the drivers such that the effect of flyback voltage caused by switching the inductive load is reduced. When current flows from the inductive load into the driver circuitry, a temporary discharge path is provided such that the body diode between the inductive load and the supply voltage is not forward biased. Conversely, when current flows from the driver circuitry into the inductive load, a temporary discharge path is provided such that the body diode between the inductive load and ground in not forward biased. The prevention of the forward biasing of the body diodes results in a reduction of the stored charge in the body diodes. This in turn results in a reduction of current and voltage spikes in the supply voltage and ground.

22 Claims, 2 Drawing Sheets

CIRCUIT TO REDUCE CURRENT AND VOLTAGE SPIKES WHEN SWITCHING INDUCTIVE LOADS

This application is a Continuation, of application Ser. No. 08/558,397 filed on Nov. 16,1995 now abandoned.

BACKGROUND OF THE INVENTION

1. Field of the Invention

The present invention relates to the field of electronic circuits. In particular, the present invention relates to electronic circuits having inductive loads.

2. Background Art

There are many applications which require control of current in inductive loads where the current must be switched (commutated) from one value to another value or from one inductive load to another inductive load. When the current through an inductor is rapidly reduced, a reverse voltage is generated that is proportional to the change in current (di/dt). If the current passing through an inductive load is abruptly interrupted, the voltage generated by the inductor can be of sufficient magnitude to damage other components. The transient is disturbing, or sometimes even destructive to other components in the electronic system. To control these transients, prior art has employed special networks attached to the inductive load to suppress or reduce the transients. In the past, devices such as flyback diodes have been used to suppress transients. Also, the prior art has used capacitor or resistor-capacitor networks to reduce transients.

One method of distributing current to an inductive load is known as pulse width modulation (PWM). Pulse width modulation causes current to be applied to the inductive load in pulses of a fixed level. Pulse width modulation controls current by controlling the width of the pulses. By switching current fully on or fully off, pulse width modulation achieves great efficiency by avoiding energy losses associated with linear current control. However, by generating pulses, pulse width modulation can introduce electrical noise into the electronic system.

A pulse width modulation system switches the current in the inductive load typically by switching the inductor voltage between ground and a supply voltage. FIG. 1 shows a typical pulse width modulation control system. According to this system the inductor voltage is switched between ground 34 and the supply voltage Vp 36 through N channel transistor Mdn 26 and P channel transistor Mup 24 respectively. The gates of Mdn 26 and Mup 24 are controlled by Ngate 22 and Pgate 20 signals respectively. Signal Vtarget 12 is the target voltage which ultimately controls the current in inductive load 40. As stated above, signals Ngate 22 and Pgate 20 control the gates of transistors Mdn26 and Mup 24. As the transistors Mdn 26 and Mup 24 toggle on and off, the current in inductive load 40 is increased or decreased. The current is sensed by sensing resistor 38 and fed back to control circuitry 14 and driver circuit 18 which generate Ngate 22 and Pgate 20 using the value and direction of the current in inductive load 40 and the value and polarity of Vtarget 12.

Thus, control circuitry 14 monitors the instantaneous current in inductive load 40 and commands driver circuit 18 to either pull node PH 32 up to Vp 36 or down to ground 34. Driver circuit 18 sequences Ngate 22 and Pgate 20 so that node PH 32 transitions are completed without simultaneous conduction of Mup 24 and Mdn 26 transistors. To properly sequence Ngate 22 and Pgate 20, driver circuit 18 employs a "break before make" timing where Mup 24 turns off before Mdn 26 turns on, and vice versa. While both transistors Mup 24 and Mdn 26 are off, the inductive load current will continue to flow. The reason is that the current through an inductor cannot change instantaneously. Moreover, the current that continues to flow from the inductive load can discharge only through paths to ground or Vp. Since both transistors Mup 24 and Mdn 26 are off, the inductive current can only discharge either through body diode Dup 28 or body diode Ddn 30. These body diodes are either naturally occurring diodes or enhanced diodes added to provide a discharge path for the current flowing from inductive load 40.

As a matter of convention, suppose that current flowing through inductive load 40 is a positive current when Ddn 30 in forward biased. In other words, the inductive current is positive when current is flowing from node PH 32 to the inductive load. Conversely, the current flowing through inductive load 40 is a negative current when Dup 28 is forward biased. Thus, the inductive current is positive when current is flowing from the inductive load into node PH 32.

A major disadvantage in the prior art pulse width modulation circuit of FIG. 1 is the sudden current and voltage spikes in Vp 36 or ground 34 and node PH 32 as described below. Suppose transistor Mup 24 is on, transistor Mdn 26 is off, and node PH 32 is high. At this time, current through inductive load 40 is a negative current, i.e. current is flowing into node PH 32 and to Vp 36 through Mup 24. Next, Mup 24 is turned off, while Mdn 26 is still off. Since the inductive load current is still flowing into node PH 32, this node will begin to rise above the supply voltage Vp 36 until diode Dup 28 is forward biased. During the time that Dup 28 is forward biased, charge is stored in Dup 28 due to the current flowing from inductive load 40 into node PH 32. Next, Mdn 26 is turned on in order to pull node PH 32 to ground. This causes a sudden discharge of the stored charge in Dup 28. The sudden discharge of diode Dup 28, is an attempt to instantaneously change the voltage across the capacitance formed between the two nodes of diode Dup 28 (i.e. node PH 32 and Vp 36).

Thus, the attempt to suddenly discharge the stored charge in Dup 28 causes a sudden voltage and current spike in Vp 36, since the voltage at Vp 36 attempts to follow the sudden change in voltage at PH 32. Thus, the turning on of transistor Mdn 26 causes a voltage and current spike in supply voltage Vp 36. This voltage and current spike in the supply voltage generates noise and causes a severe disruption of circuit operation. Furthermore, the sudden discharge of the stored charge in Dup 28 causes a large current to flow through Mdn 26. This current can be as high as, or higher than, ten times the current passing through Mdn 26 during normal operation. This large current can overstress Mdn 26 and change the behavior of transistor Mdn 26 or cause circuit reliability problems.

Similar to the situation explained above, but due to a reverse process, a voltage and current spike in ground 34 occurs when node PH 32 is to make a transition from low to high. This voltage and current spike in ground 34 also results in noise and severe disruption in operation of the typical prior art circuit of FIG. 1.

The presently known methods to reduce the generation of the current and voltage spikes when node PH 32 transitions low or high are inadequate. For example, one known method to offset the effect of the current and voltage spikes in Vp 36 and ground 34 is to increase the current handling ability of Mdn 26 and Mup 24 transistors. This reduces possible damage to the transistors, but does not alleviate the system disruption caused by the current spikes in the power supply. The disadvantage of this approach is that, in addition to not solving the system disruption problems, the increase in the sizes of transistors Mdn 26 and Mup 24 results in an increased size of the circuit, and therefore an increased cost.

Another known method to reduce the generation of the current and voltage spikes when node PH 32 transitions low or high is to add Schottky diodes in parallel to body diodes Dup 28 and Ddn 30. A Schottky diode has a lower forward bias voltage and a shorter carrier lifetime than body diodes Dup 28 and Ddn 30. Accordingly, the voltage drop across the parallel Schottky diodes is lower than the voltage drop across the body diodes and the flyback current discharged through body diodes Dup 28 and Ddn 30 is reduced. The shorter carrier lifetime reduces the "on" capacitance of the diode. Therefore, the current and voltage spikes in the supply voltage and ground are reduced. The disadvantage of this technique is that addition of Schottky diodes adds to the expense of fabricating the circuit.

Yet another known method to reduce the generation of current and voltage spikes in the ground and supply voltage is to slow down the turning on of transistors Mup 24 an Mdn 26. For example, if Mdn 26 is turned on slowly, the stored charge in body diode Dup 28 is not discharged quickly. Thus, the magnitude of the current and voltage spikes in supply voltage Vp 36 and ground 34 is reduced. Likewise, when Mup 24 is turned on slowly, the magnitude of the current and voltage spikes in the supply voltage and ground is diminished. One disadvantage of this technique is the difficulty to precisely control the speed with which transistors Mup 24 and Mdn 26 are turned on. This is especially true when transistors Mup 24 and Mdn 26 are external to control circuitry 14 and driver circuit 18. In that case, the threshold voltages of transistors Mup 24 and Mdn 26 may not be matched with control circuitry 14 and driver circuit 18. Thus, the threshold voltages of transistors Mup 24 and Mdn 26 cannot be precisely known or controlled. Another disadvantage of this technique is that slowing down the turning on of transistors Mup 24 and Mdn 26 increases the switching time of the circuit.

Thus, there is need in the art for a circuit and a method to significantly reduce the current and voltage spikes generated in the supply voltage and ground of circuits that switch inductive loads. The need in the art is for a circuit that achieves reduced voltage and current spikes without an increased expense, power consumption, size, or switching time.

SUMMARY OF THE INVENTION

The present invention discloses a circuit to reduce current and voltage spikes when switching inductive loads. The circuit of the present invention achieves this reduction in voltage and current spikes without requiring the prior art's large sizes for the transistors driving the inductive load. The invention results in reduced cost and power consumption. The invention does not require the prior art's Schottky diodes which add to the expense and the power consumption of the circuit. Moreover, the invention's circuit maintains a fast switching time for the transistors driving the inductive load.

The invention's circuit comprises a current steering mechanism which directs current to one of the two drivers driving an inductive load. According to the invention, current is directed to the driver coupled to the supply voltage, the driver coupled to ground, or both in different amounts. The current is directed to the drivers such that the effect of flyback voltage caused by switching the inductive load is reduced. When current flows from the inductive load into the driver circuitry, a temporary discharge path is provided such that the body diode between the inductive load and the supply voltage is not forward biased. Conversely, when current flows from the driver circuitry into the inductive load, a temporary discharge path is provided such that the body diode between the inductive load and ground in not forward biased. The prevention of the forward biasing of the body diodes results in a reduction of the stored charge in the body diodes. This in turn results in a reduction of current and voltage spikes in the supply voltage and ground.

DETAILED DESCRIPTION OF THE PRESENT INVENTION

A circuit to reduce current and voltage spikes when switching inductive loads is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 1:
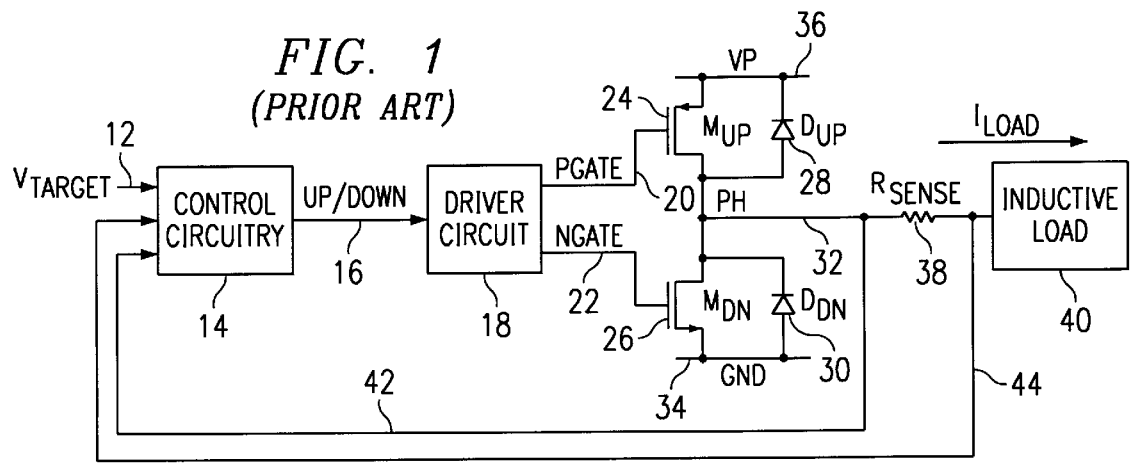
FIG. 1 shows a typical prior art pulse width modulation control system.
Figure 2:
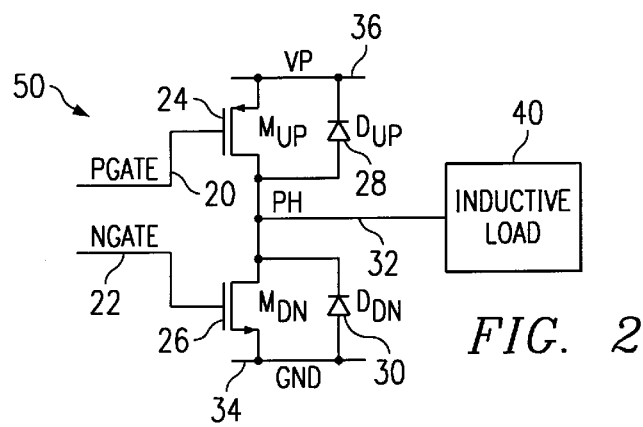
FIG. 2 illustrates the driver circuit of the present invention for driving an inductive load.

An overview of the operation of the present invention is explained by reference to the core circuit 50 of FIG. 2. The circuit of the invention includes two halves. One half of the circuit controls when PH is to transition from high to low, and the other half of the circuit controls when PH it to transition from low to high. Each half of the circuit controls both Pgate 20 and Ngate 22 signals. Thus, each half of the circuit of the invention controls both Mup 24 and Mdn 26.

The circuit of the invention operates by carefully overlapping the conduction of Mdn 26 and Mup 24 transistors. This is accomplished by carefully controlling the timing of Pgate 20 and Ngate 22 signals. The careful timing control Pgate 20 and Ngate 22 results in a window of simultaneous conduction of both Mdn 26 and Mup 24. This results in a reduction of the charge stored in the body diodes, and further it results in preventing rapid discharge of the charge that is still stored in the body diodes. Thus, one purpose of the circuit of the present invention (when node PH 32 is to transition from high to low) is to keep Mup 24 on long enough so as to prevent the forward biasing of diode Dup 28.

Concurrently, Mdn 26 is slightly turned on prior to totally turning off Mup 24. This prevents a large charge built up in Dup 28 and it also prevents a rapid discharge of the stored charged in Dup 28, thus preventing the prior art overstressing of Mdn 26. Likewise, one purpose of the circuit of the present invention (when node PH 32 is to transition from low to high) is to keep Mdn 26 on long enough so as to prevent the forward biasing of diode Dup 24. Concurrently, Mup 24 is slightly turned on prior to totally turning off Mdn 26. This prevents a rapid discharge of the stored charged in Ddn 30, hence preventing the prior art overstressing of Mup 24.

Consider the operation of that half of the circuit of the invention that is to control transistors Mup 24 and Mdn 26 while node PH 32 is to transition from a high state to a low state. As stated above, prior to transition of node PH 32 from high to low, i.e. when PH 32 is still high, transistor Mup 24 is on while transistor Mdn is off. In other words, both Pgate 20 and Ngate 22 are low. In this state, the current through inductive load 40 is a negative current In other words, the current flows from inductive load 40 into node PH 32. As a result, the voltage at PH 32 is slightly higher than the supply voltage at Vp 36. The reason is that current flows from PH 32 through Mup 24 to Vp 36. Thus, the voltage at PH 32 is equal to Vp plus the current passing through Mup 24 multiplied by the equivalent resistance of Mup 24.

The circuit of the invention simultaneously controls both Ngate 22 and Pgate 20 by a current steering mechanism. The invention's current steering circuit precisely controls the voltage at Ngate 22 and Pgate 20 depending on the voltage at node PH 32. At different times during the transition of node PH 32 from high to low, depending on the magnitude of the current in the inductive load, the invention's current steering circuit directs current to adjust and control the voltage at Pgate 20 and Ngate 22. For example, if most of the current is steered such that the voltage at Pgate 20 is increased quickly, the voltage at Ngate 22 will change slowly, or vice versa. As explained below, the control of voltages at Pgate 20 and Ngate 22 may involve switches and current mirrors for controlling current gain of the current steering circuit and for translating the current directed to Ngate 22 and Pgate 20 to appropriate voltage levels.

Figure 3:
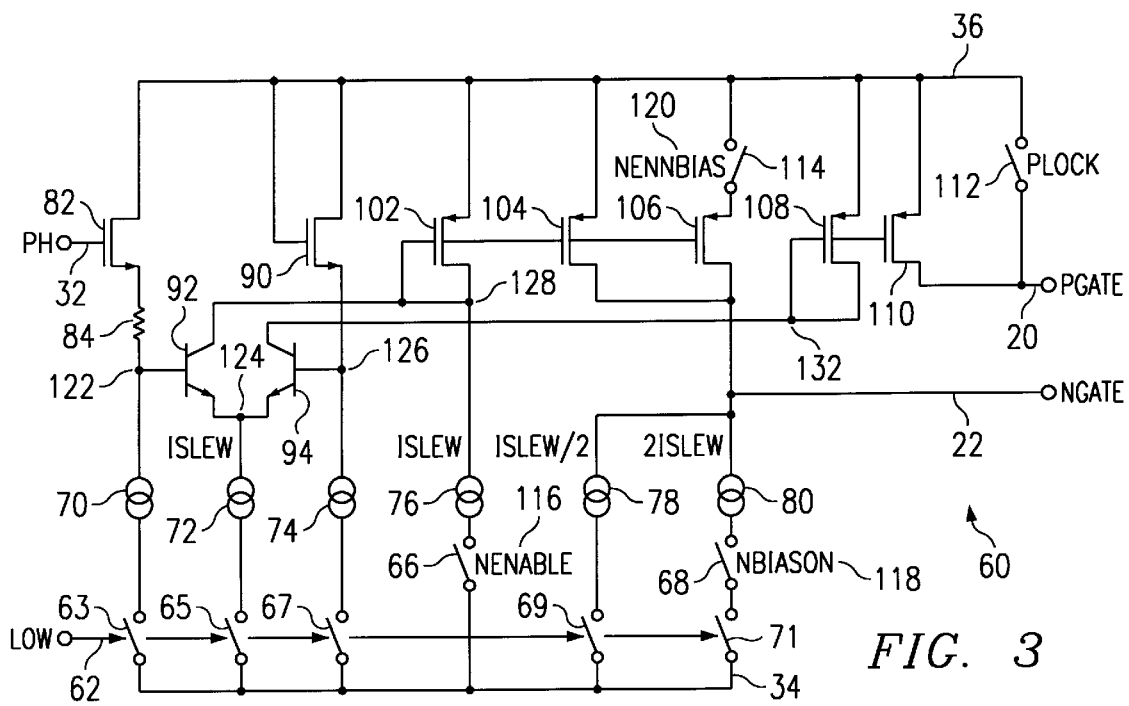
FIG. 3 shows the circuit of the present invention, including the current steering circuit of the invention, for reducing current and voltage spikes when switching inductive loads.

The configuration and operation of the circuit of the present invention is now discussed in more detail by reference to FIG. 3. For simplicity, the operation of the circuit of the invention is explained only with respect to that half of the circuit of the present invention which controls Pgate 20 and Ngate 22 when PH 32 is to transition from high to low. It is that half of the circuit of the invention that is shown in FIG. 3. The other half of the circuit of the invention (not shown in FIG. 3) controls Pgate 20 and Ngate 22 when PH is to transition from low to high. The configuration and operation of that half of the circuit of the invention not shown in FIG. 3 will be apparent from the explanation given with respect to FIG. 3.

The current steering circuit of the invention shown in FIG. 3 comprises signal Low 62 which controls switches 63, 65, 67, 69, and 71. Switches 63, 65, 67, 69, and 71 are typically N channel transistors. Switches 63, 65, 67, and 69 are connected at one end to ground 34. At the other end, switches 63, 65, 67, and 69 are connected to current sources 70, 72, 74, and 78 respectively. Switch 71 is connected at one end to ground 34 and at the other end to switch 68. Signals Nenable 116 and Nbiason 118 control switches 66 and 68, respectively. Switch 66 is connected at one end to ground 34 and to current source 76 at the other end. Switch 68 is connected to switch 71 at one end and to current source 80 at the other end. Switches 66 and 68 are typically N channel transistors.

Current sources 70, 72, 74, 76, 78, and 80 provide bias current to the circuit of the invention. The bias currents 72, 76, 78, and 80 are determined in relation with a reference current Islew. The reference current Islew is generated according to methods well known in the art. The circuit used for generation of Islew is not shown and is not explained in the present application not to obscure the present invention. Each of current sources 72 and 76 generates a current which typically matches Islew. Current source 78 generates a current typically equal to Islew/2, while current source 80 generates a current typically equal to 2* Islew. Current source 70 is designed to create a constant voltage drop across resistor 84. Current source 74 is designed to match current source 70.

Current source 70 has one end coupled to switch 63 and one end coupled to node 122. Node 122 is shared between resistor 84 and the base of NPN transistor 92. Current source 72 has one end coupled to switch 65 and one end coupled to node 124. Node 124 is shared between the emitters of NPN transistors 92 and 94. Current source 74 is coupled at one end to node 126 and at the other end to switch 67. Node 126 is shared between the base of NPN transistor 94 and the source of N channel transistor 90. Current source 76 is connected at one end to switch 66 and at the other end to node 128. Node 128 is shared between the drain of P channel transistor 102, the collector of NPN transistor 92, and the gates of P channel transistors 102, 104, and 106. Current source 78 is coupled at one end to switch 69 and at the other end to Ngate 22. Ngate 22 is shared between current source 80 and the drains of P channel transistors 104 and 106. Current source 80 is connected at one end to switch 68 and at the other end to Ngate 22. Ngate 22 is shared between current sources 78 and 80 and the drains of P channel transistors 104 and 106.

NPN transistor 92 has its emitter connected to node 124. Node 124 is shared between the emitter of NPN transistor 94 and one end of current source 72. The base of NPN transistor 92 is connected to node 122. Node 122 is shared between one terminal of resistor 84 and one terminal of current source 70. The collector of NPN transistor 92 is connected to node 128. Node 128 is shared between the drain terminal of P channel transistor 102, one terminal of current source 76, and the gates of P channel transistors 102, 104, and 106. NPN transistor 94 has its emitter connected to node 124. Node 124 is shared between the emitter of NPN transistor 92 and one end of current source 72. The base of NPN transistor 94 is connected to node 126. Node 126 is shared between the source of N channel transistor 90 and one terminal of current source 74. The collector of NPN transistor 94 is connected to node 132. Node 132 is shared between the drain of P channel transistor 108 and the gates of P channel transistors 108 and 110.

N channel transistor 82 has its gate connected to node PH 32. The drain of N channel transistor 82 is connected to Vp 36, while its source is connected to one terminal of resistor 84. Resistor 84 has one terminal connected to the source of transistor 82 and the other terminal connected to node 122. Node 122 is shared between the base of NPN transistor 92 and one terminal of current source 70. N channel transistor 90 has its drain and gate connected to Vp 36, while it source connected to node 126. Node 126 is shared between the base of NPN transistor 94 and one terminal of current source 74. P channel transistor 102 has its source connected to Vp 36 and its drain connected to node 128. The gate of transistor 102 is also connected to node 128. Node 128 is shared between the collector of NPN transistor 92, one terminal of current source 76, and the gates of transistors 104 and 106.

P channel transistor 104 has its source connected to Vp 36 and its drain connected to Ngate 22. Ngate 22 is shared between current sources 78, 80, and the drain of P channel transistor 106. The gate of transistor 104 is connected to node 128. Node 128 is shared between the collector of NPN transistor 92, one terminal of current source 76, and the gates of transistors 102 and 106. P channel transistor 106 has its source connected to one end of switch 114 and its drain connected to Ngate 22. Switch 114 has one end connected to the source of transistor 106 and the other end to Vp 36. Ngate 22 is shared between current sources 78, 80, and the drain of P channel transistor 104. The gate of transistor 106 is connected to node 128. Node 128 is shared between the collector of NPN transistor 92, one terminal of current source 76, and the gates of transistors 102 and 104.

P channel transistor 108 has its source connected to Vp 36 and its drain connected to node 132. Node 132 is shared between the collector of NPN transistor 94 and the gates of transistors 108 and 110. P channel transistor 110 has its source connected to Vp 36 and its drain connected to Pgate 20. Pgate 20 is shared between the drain of transistor 110 and one terminal of switch Plock 112. The gate of P channel transistor 110 is connected to node 132. Node 132 is shared between the collector of NPN transistor 94 and the gate and drain of transistor 108. Switch Plock 112 has one terminal connected to Vp 36 and the other terminal connected to Pgate 20. Pgate 20 is shared with the drain of transistor 110.

In operation, suppose node PH 32 is to transition from high to low. Just prior to PH transitioning from high to low, and during the transition, it is important to carefully control conduction of Mup 24 and Mdn 26. Mup 24 should be kept on to avoid, or slow down, PH 32 rising too far above Vp 36. If Mup 24 were totally off (which is the case in the prior art), the current from inductive load 40 could only discharge through Dup 28. This would cause the voltage at PH 32 to rise to Vp plus the forward bias voltage for Dup 28. This increase in the voltage of PH 32 would forward biases Dup 28 and would cause a large amount of charge to be stored in Dup 28.

For this reason, the circuit of the invention carefully controls PH 32. According to the invention, the increase in PH 32 voltage is avoided or slowed down by keeping Mup 24 slightly on to ensure that there is another path for flow of current provided by inductive load 40. Based on the specific circuit parameters of the invention, PH 32 can be controlled so that diode Dup 28 is never forward biased, or alternatively, Dup 28 is only slightly forward biased for a short period of time. In either case, the charge stored in Dup 28 is significantly reduced as compared with the prior art. In the embodiment of the invention shown in FIG. 3, the voltage at node PH is controlled so that it will always remain below Vp+0.3. In this condition, Dup 28 would not be forward biased and the charge built up in Dup 28 is avoided.

Continuing with the same circuit state stated above, i.e. the state of PH 32 just prior to making a transition from high to low and during such a transition, Mdn 26 should be on prior to the complete turning off of Mup 24. The reason is that if, as is the case in the prior art, Mdn 26 were not on yet when Mup 24 is completely off, the current flowing from inductive load 40 would only have a path through Dup 28 to discharge. However, when Mdn 26 is sufficiently on, the current from inductive load 40 discharges through Mdn 26, thus preventing the charge built up in Dup 28. Furthermore, during the time that Mdn 26 is on, some of the charge already built up in Dup 28 is discharged through Mdn 26 prior to Mdn being completely on. Thus, some of the charge stored in Dup 28 is discharged prior to creation of a low impedance path to ground. This avoids overstressing Mdn 26 when Mdn 26 is fully turned on since the low impedance path created by a fully turned on Mdn 26 would pass a smaller current to ground.

Thus, the circuit of the invention carefully controls the voltage at PH 32. According to the present invention, the increase in PH 32 is hindered by turning Mdn 26 slightly on prior to the complete turning off of Mup 24. This gives the current flowing from inductive load 40 an additional path to discharge, thus reducing the charge built up in Dup 28. Also, during the time that Mdn 26 is slightly on, some of the charge already built up in Dup 28 is discharged through Mdn 26 prior to existence of a low impedance path to ground. This avoids overstressing Mdn 26 when Mdn 26 is fully turned on since the low impedance path created by a fully tuned on Mdn 26 would pass a smaller current to ground.

The careful control of overlapping conduction of Mup 24 and Mdn 26 is achieved by the invention's current steering mechanism. Current is carefully steered to Pgate 20, Ngate 22, or both, in different amounts to control the voltage at nodes Pgate 20 and Ngate 22. Signal Low 62 is asserted high just prior to downward transition of node PH 32. Assertion of Low 62 causes current sources 70, 72, and 74 to draw current from NPN transistor pair 92 and 94. N channel transistor 82 and resistor 84 create a level shifter that, together with current source 70, set the voltage at the base of transistor 92. Likewise, N channel transistor 90 also behaves as a level shifter which, together with current source 74, set the voltage at the base of transistor 94. Resistor 84 is designed so that the level shifter at the base of transistor 92 creates a 0.3 volt offset in relation to the level shifter at the base of transistor 94.

The voltage at the base of transistor 92 is dependent on the source voltage of N channel transistor 82. The source voltage of N channel transistor 82 is determined by the value of voltage at node PH 32. The higher the voltage at PH 32, the higher is the source voltage of transistor 82. The gate to source voltage of transistor 82 plus the voltage drop across resistor 84 is equal to the voltage difference between PH 32 and the base of transistor 92. This voltage difference is also referred to as an "offset voltage" in this application. Thus, as the voltage at PH 32 increases, the voltage at the base of transistor 92 (node 122) will get closer to the supply voltage (Vp 36).

It is noted that the "offset voltage," namely the voltage difference between PH 32 and the base of transistor 92, can be set by means other than that described above and shown in FIG. 3. For example, the "offset voltage" can be set by a sum of the gate to source voltage of transistor 82, the voltage drop across resistor 84, a source to gate voltage of a P channel transistor (not shown in FIG. 3) whose source is connected to resistor 84, and a base to emitter voltage of an NPN transistor (also not shown in FIG. 3) whose base is connected to the drain of the P channel transistor. Manifestly, the precise circuit configuration to generate the offset voltage can be modified without departing from the scope of the present invention.

Although the voltage at the base of transistor 92 is determined by the variable voltage at node PH 32, the voltage at the base of transistor 94 is relatively constant: When Low 62 is asserted, the current drawn from N channel transistor 90 through current source 74 sets the voltage at the base of transistor 94 (node 126). This is because the voltage at the gate of transistor 90 is fixed and thus transistor 90 will have a constant gate to source voltage. Upon assertion of Low 62, current source 72 also draws a constant current from the emitters of transistor pair 92 and 94. This current is almost equal to the total current from collectors of transistors 92 and 94. The collector current of transistor 92 is dependent on the variations in the voltage at node PH 32. As the voltage at PH 32 increases, the collector current of transistor 92 also increases. Since the sum of the currents passing through the collectors of transistors 92 and 94 is almost constant, when the collector current of transistor 92 increases, the collector current of transistor 94 must decrease. Thus, as the voltage at PH 32 increases, the collector current of transistor 94 decreases.

This decrease is mirrored by the current mirror formed by P channel transistors 108 and 110. In the embodiment of the invention shown in FIG. 3, the 0.3 volt level shift at the base of transistor 92 causes a reduction in the collector current of transistor 94 when PH 32 is about to rise above Vp+0.3 volts. On the other hand, the collector current of transistor 92 is increased when PH 32 rises above Vp+0.3 volts. The reduced collector current of transistor 94 is mirrored by transistors 108 and 110. This reduced mirrored current causes less current to be routed to Pgate 20. On the other hand, the increase in collector current of transistor 92 is mirrored by transistors 104 and 106. This increased mirrored current causes more current to be routed to Ngate 22 (for now it is assumed that Nbiason 118 is asserted high so that switch 68 is closed).

The result is that as PH 32 rises above Vp+0.3, more current is routed to Ngate 22 and less current to Pgate 20. This assures that when PH 32 is beginning to rise above Vp+0.3, Mdn 26 is on to avoid charge built up in Dup 28. Furthermore, Mup 24 is turned sufficiently on so that diode Dup 28 is not forward biased, thus preventing accumulation of a large charge in Dup 28. Once PH 32 is pulled below Vp+0.3, more current is routed to Pgate 20 in order to increase the on resistance of Mup 24. This results in a quicker transition of PH 32 to ground through Mdn 26. This also reduces simultaneous conduction of Mup 24 and Mdn 26, thus increasing the speed of PH 32 transition to ground and reducing power consumption.

Once PH 32 discharges below the supply voltage Vp 36, the collector current of transistor 94 increases. This in turn causes Pgate 20 to rise. As Pgate 20 rises, transistor Mup 24 begins to completely turn off. This in turn accelerates the discharge of PH 32. As PH 32 begins to discharge, Pgate begins to increase to turn Mup 24 completely off. This permits PH 32 to drop to ground voltage through Mdn 26 (as described below, Mdn 26 is completely turned on at this point in time). Finally, switch Plock 112 is closed when Nenable 116 is asserted high. Nenable 116 is asserted high when Pgate 20 reaches Vp-1. At this point, Mup 24 is completely off and PH 32 is permitted to quickly complete its transition to ground. Switch Plock 112 ensures that Pgate 20 remains high during the PH low time, thus ensuring that Mup 24 is completely off while PH remains low.

To sum up, when the inductive current flow from load 40 begins to force PH 32 to surge above Vp 36, Mup 24 remains on to prevent a high charge built up in Dup 28. After sufficient time has passed and the current from inductive load 40 has been partially discharged through Mup 24 and Mdn 26, Mup 24 is turned off to allow PH 32 to be pulled to ground through Mdn 26.

Turning to control signals Nenable 116, Nbiason 118, and Nennbias 120, these control signals control the current mirror formed by P channel transistors 102, 104, and 106. As discussed above, these transistors mirror the current from the collector of transistor 92 to Ngate 22. When the collector current of transistor 92 is increased, the current mirrored to Ngate 22 is also increased. As stated above, the turning on of Nenable 116 occurs when Pgate has reached Vp-1. The assertion of Nenable 116 causes current source 76 to draw current from P channel transistor 102 and the collector of transistor 92. This results in a reduction of the gate voltages of transistors 104 and 106. This in turn results in an increase in the voltage at Ngate 22. The increase in the voltage at Ngate 22 expedites transition of node PH 32 to ground. Nenable 116 is held high for the duration of the PH low time.

Nbiason 118 is asserted high when Low 62 is asserted and is deasserted hen Pgate 20 reaches approximately Vp-4.5. The assertion of Nbiason 118 causes current source 80 to pull Ngate 22 towards ground. Thus, the assertion of Nbiason 118 slows down the turning on of Mdn 26. This is desired when Mup 24 is still on (i.e. when Pgate 20 is below Vp-4.5) in order to avoid a strong conductive path between Vp 36 and ground. When Pgate 20 begins to rise above Vp-4.5, Nbiason 118 is deasserted to allow Ngate 22 to rise more rapidly, thus expediting the turning on of Mdn 26.

Nbiason 118 together with Nennbias 120 are also used to reduce the current gain of the current mirror formed by transistors 104 and 106. The current steering circuit of the invention, including the current mirror formed by transistors 104 and 106, is part of a closed loop feedback circuit when PH 32 is close to Vp+0.3. The loop gain of the current steering circuit is quite large while Mdn 26 is conducting most of the load current and Mup 24 is almost off. This condition occurs when Pgate 20 reaches approximately Vp-4.5. At this point, Nbiason 118 and Nennbias 120 are deasserted in order to reduce the current gain of the current mirror formed by transistors 104 and 106. This prevents high speed oscillations due to the large gain in the feedback loop. Finally, signal Low 62 is deasserted low when Ngate is greater than Vp-1. At this point node PH 32 is at ground voltage and the current steering circuit is disabled by deasserting signal Low 62.

Figure 4:
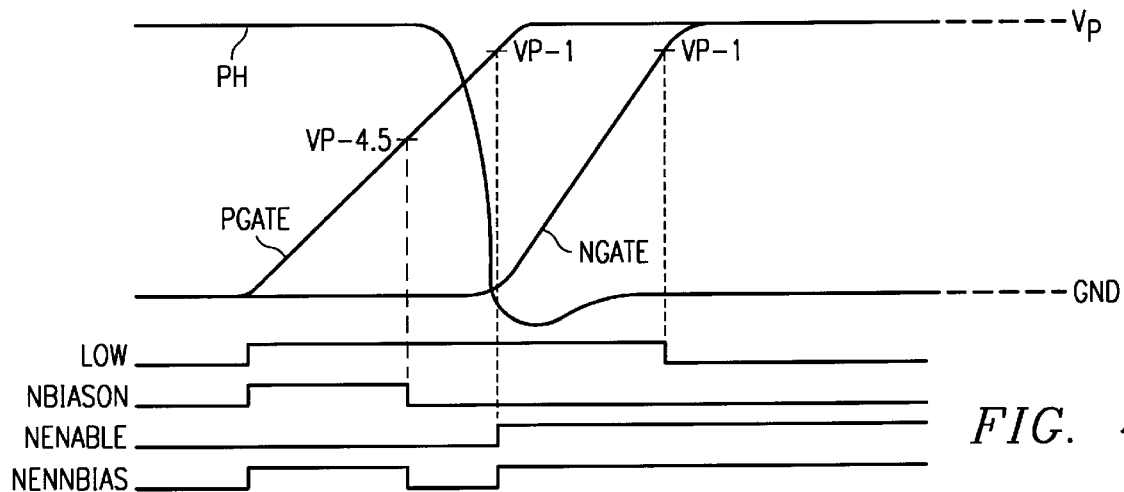
FIG. 4 illustrates waveforms of nodes PH 32, Pgate 20, and Ngate 22 as a function of signals Low 62, Nenable 116, Nbiason 118, and Nennbias 120 for a case where there is positive inductive load current.
Figure 5:
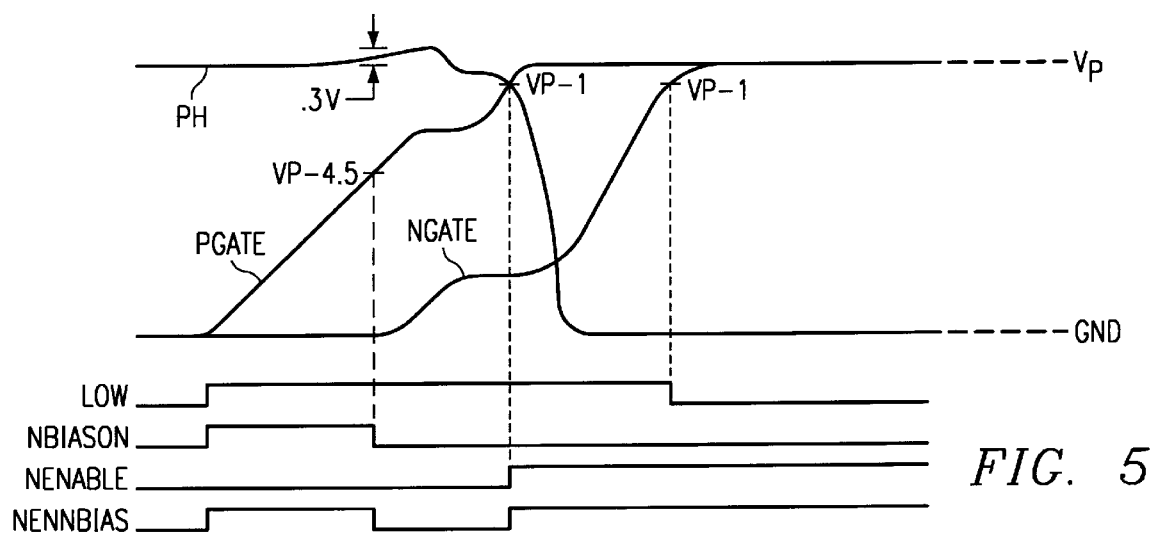
FIG. 5 shows waveforms of nodes PH 32, Pgate 20, and Ngate 22 as a function of signals Low 62, Nenable 116, Nbiason 118, and Nennbias 120 for a case where there is a low inductive load current flowing into node PH 32.
Figure 6:
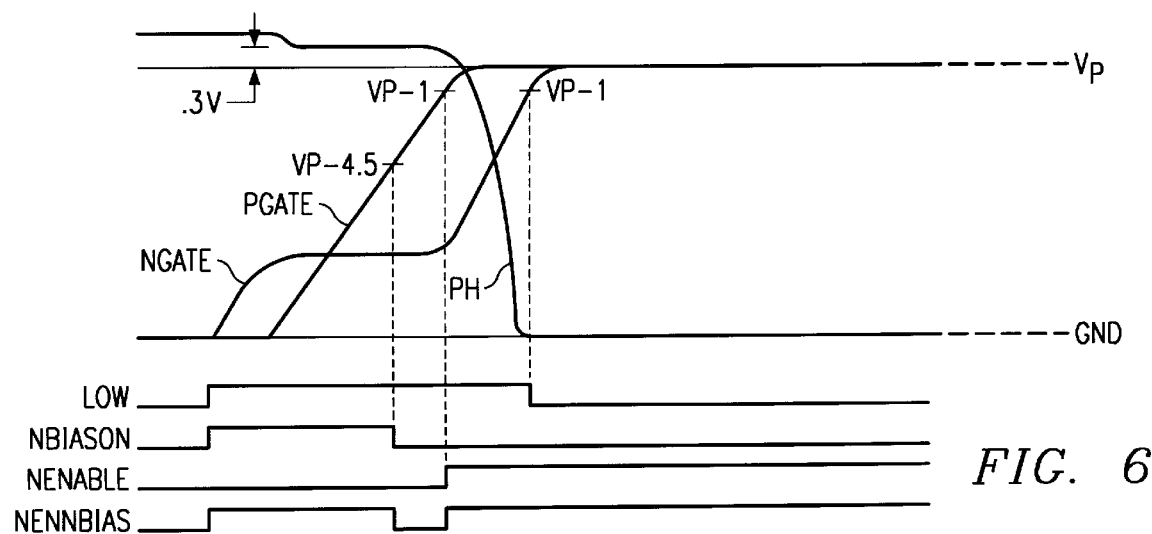
FIG. 6 depicts waveforms of nodes PH 32, Pgate 20, and Ngate 22 as a function of signals Low 62, Nenable 116, Nbiason 118, and Nennbias 120 for a case where there is a high inductive load current flowing into node PH 32.

FIGS. 4 through 6 illustrate the waveforms of nodes PH 32, Pgate 20, and Ngate 22 as a function of signals Low 62, Nenable 116, Nbiason 118, and Nennbias 120. In the embodiment of the invention whose waveforms are illustrated in FIGS. 4 through 6, the power supply voltage (Vp 36) is 12 volts. FIG. 4 illustrates a condition where there is current flowing from node PH 32 into inductive load 40. Signal Low 62 is first asserted to enable the current steering circuit of the invention. When Low 62 is asserted, PH 32 is initially slightly lower than Vp 36 due to the voltage drop across the source-drain terminals of Mup 24. This voltage drop is due to the "on" resistance of Mup 24 and the current drawn by inductive load 40. In this condition, the current steering circuit steers most of its current to Pgate 20, causing it to rise quickly as shown in FIG. 4.

When Pgate 20 reaches Vp-4.5, Nbiason 118 and Nennbias 120 are deasserted low. These signals have no effect in this transition because Mdn 26 is not on yet. When Pgate 20 reaches Vp-1 (at which point Mup 24 is turned off), node PH 32 falls due to the current drawn from inductive load 40. In fact, PH 32 falls low enough (below the ground voltage) to forward bias body diode Ddn 30. Also, when Pgate 20 reaches Vp-1, Nenable 116 is asserted high, causing Ngate 22 to rise. When Ngate 22 reaches the threshold voltage of Mdn 26, node PH 32 is pulled up towards the ground voltage due to the reduced "on" resistance of Mdn 26. In the example of FIG. 4, since PH 32 never rises above the supply voltage, Ngate 22 rises in response to the assertion of Nenable 116 and not due to the operation of the current steering circuit.

FIG. 5 illustrates a condition where there is a small current flowing from inductive load 40 into node PH 32. Signal Low 62 is first asserted to enable the current steering circuit of the invention. When Low 62 is asserted, PH 32 is initially slightly higher than Vp 36 due to the current flowing into Mup 24 and the "on" resistance of Mup 24. Since PH 32 is below Vp+0.3 volts, the current steering circuit causes Pgate 20 to rise. As Pgate 20 nears Vp−1, the "on" resistance of Mup 24 begins to increase, causing PH 32 to rise. When PH 32 reaches Vp+0.3 volts, the current steering circuit begins routing more current to Ngate 22. When Ngate 22 reaches the threshold voltage of Mdn 26, the current steering circuit causes both Ngate 22 and Pgate 20 to rise in order to maintain PH 32 at Vp+0.3 volts. In case of an overshoot, PH 32 will be pulled lower than PH+0.3 volts. In that case, Ngate 22 will be held nearly constant while Pgate 20 rises. When Pgate 20 reaches Vp−1, Nenable 116 is asserted high to complete the rise of Ngate 22. Nennbias 120 and Nbiason 118 are held low while Pgate 20 is between Vp−4.5 and Vp−1. This reduces the loop gain of the current steering amplifier which increases the stability of the loop during this high gain region.

FIG. 6 illustrates a condition where there is a high current flowing from inductive load 40 into node PH 32. Signal Low 62 is first asserted to enable the current steering circuit of the invention. When Low 62 is asserted, PH 32 is initially higher than Vp+0.3 volts due to the large current flowing into Mup 24 and the "on" resistance of Mup 24. As a result, the current steering circuit causes Ngate 22 to rise until Mdn 26 pulls PH 32 down to Vp+0.3 volts. At this point, the current steering circuit controls Ngate 22 to maintain PH 32 at about Vp+0.3 volts. The remaining current from the current steering circuit causes Pgate 20 to rise. As Pgate 20 approaches Vp−1, the current through Mup 24 is reduced and conduction by Mdn 26 is increased. When Pgate 20 reaches Vp−1, Mup 24 is completely off and the inductive load current is completely carried by Mdn 26. At this point, Nenable 116 is asserted high to complete the rise of Ngate 22, causing PH 32 to fall to near the ground voltage. Again, Nennbias 120 and Nbiason 118 are held low while Pgate 20 is between Vp−4.5 and Vp−1. This reduces the loop gain of the current steering amplifier which increases the stability of the loop during this high gain region.

The circuit of the invention is complete as described above and as shown in FIGS. 2 and 3. However, an embodiment of the circuit of the invention utilizes two halves. One half is controlling during the transition of PH 32 from high to low. That half was explained above. The other half which is controlling when PH 32 makes a transition from low to high operates similar to the half that was explained above. A difference being that node PH 32 is monitored so that it does not fall too far below the ground voltage. In one implementation of the embodiment of the invention that utilizes two halves, node PH 32 is monitored so that it does not fall below Gnd−0.3 volts.

In the embodiment that utilizes two halves, the half of the invention that controls when PH 32 makes a transition from low to high has its own control signals (which are analogous to, but separate from, the control signals for the other half that controls when PH 32 makes a transition from high to low). For example, a signal High (not shown in the drawings) is analogous to signal Low 62. Likewise, signals Penable, Nlock, Pbiason, and Penpbias correspond to signals Nenable 116, Plock 112, Nbiason 118, and Nennbias 120 respectively (signals Penable, Nlock, Pbiason, and Penpbias are not shown in any of the drawings). The timing of signals Penable, Nlock, Pbiason, and Penpbias, High, Pgate, and Ngate during the operation of the half that controls PH 32's transition from low to high is similar to the timing of their corresponding signals which were discussed above.

In the half of the invention that controls when PH 32 makes a transition from low to high, the offset voltage used to offset PH 32 in driving the current steering means can be generated by a slightly different circuit configuration than that previously described. For example, the offset voltage can be generated by a sum of the gate to source voltage of a P channel transistor and a voltage drop across a resistor. Alternatively, the offset voltage can be generated by a sum of the gate to source voltage of a P channel transistor, a base to emitter voltage of a first NPN transistor having its emitter connected to the source of the P channel transistor, a base to emitter voltage of a second NPN transistor whose emitter is connected to the collector of the first NPN transistor, a voltage drop across a resistor whose first terminal is connected to the collector of the second NPN transistor, and a base to emitter voltage of a third NPN transistor whose base is connected to the second terminal of the resistor. Manifestly, the precise circuit configuration to generate the offset voltage can be modified without departing from the scope of the present invention.

The configuration and operation of the half of the circuit of the invention not discussed above is apparent in light of the detailed description given above with respect to the operation of the half of the circuit of the invention that controls when PH 32 makes a transition from high to low. Accordingly, a discussion of the configuration and operation of the half of the circuit of the invention operating when PH 32 makes a transition from low to high is duplicative and would obscure the invention. Such a discussion is therefore not undertaken in this application.

It is noted that many of the circuit parameters discussed in the above detailed description are given as examples only. These circuit parameters can be changed without departing from the scope of the present invention. For example, the specific values for the power supply voltage (stated above to be 12 volts), and the 0.3v offset voltage between the level shifters can be changed as desired. Also, the triggering of different signals and circuit conditions by comparing the voltage at Pgate 20 and Ngate 22 to Vp−1 or to Vp−4.5 can be changed as desired. Moreover, upon an appropriate design of current mirrors in the circuit of the invention, a current gain reduction may not be needed. Even if a current gain reduction is needed, techniques other than using switches controlled by Nbiason 118 and Nennbias 120 may be employed.

The invention described above overcomes many of the prior art disadvantages. For example, the invention does not require the prior art's large sizes for Mdn 26 and Mup 24 in order to reduce the effects voltage and current spikes. The invention does not result in increased cost and power consumption. The invention does not require Schottky diodes which add to the expense and the power consumption of the circuit. The invention does not require precise control of the threshold voltages of Mup 24 and Mdn 26. Finally, the invention does not cause a significant reduction in the switching time of Mup 24 and Mdn 26.

Although the present invention has been described with reference to an illustrated embodiment, it is appreciated by those skilled in the art that changes in various details may be made without departing from the invention defined in the appended claims. Thus, a circuit to reduce current and voltage spikes when switching inductive loads has been described.

I claim:

1. A circuit comprising:
   an inductive load;
   a first driver for providing a path for a first signal from said inductive load to a terminal for a supply voltage;
   a second driver for providing a path for said first signal from said inductive load to a terminal for ground;
   a current steering circuit for directing current to said first and second drivers to turn on said first and second drivers;
   said current steering circuit being driven by a second signal, said
   second signal having a first offset voltage with respect to said first signal;
   said current steering circuit increasing current directed to said second driver when said first signal rises above a threshold voltage to simultaneously turn on said first and second drivers, said threshold voltage being above said supply voltage by a second offset voltage.

2. The circuit of claim 1, wherein said first driver is a P channel Field Effect Transistor (PFET).

3. The circuit of claim 1, wherein said second driver is an N channel Field Effect Transistor (NFET).

4. The circuit of claim 1, wherein said current steering circuit comprises a transistor pair to direct current to said first and second drivers, one transistor in said transistor pair being driven by said second signal.

5. The circuit of claim 1, wherein said current steering circuit comprises an NPN transistor pair to direct current to said first and second drivers, one of said NPN transistors being driven by said second signal.

6. The circuit of claim 1, wherein said supply voltage is equal to twelve volts.

7. The circuit of claim 1, wherein a low signal is asserted to activate said circuit when said first signal makes a transition from high to low.

8. A circuit comprising:
   an inductive load;
   a first driver for providing a path for a first signal from said inductive load to a terminal for a supply voltage;
   a second driver for providing a path for said first signal from said inductive load to a terminal for ground;
   a current steering circuit for directing current to said first and second drivers;
   said current steering circuit being driven by a second signal,
   said second signal having a first offset voltage with respect to said first signal;
   said current steering circuit increasing current directed to said second driver when said first signal rises above a threshold voltage, said threshold voltage being above said supply voltage by a second offset voltage, wherein said current steering circuit comprises an NPN transistor pair to direct current to said first and second drivers, one of said NPN transistors being driven by said second signal, wherein a collector current from each of said NPN transistors is mirrored by at least one current mirror such that when said first signal rises above said threshold voltage, said current mirror directs current to said second driver.

9. A circuit comprising:
   an inductive load;
   a first driver for providing a path for a first signal from said inductive load to a terminal for a supply voltage;
   a second driver for providing a path for said first signal from said inductive load to a terminal for ground;
   a current steering circuit for directing current to said first and second drivers;
   said current steering circuit being driven by a second signal,
   said second signal having a first offset voltage with respect to said first signal;
   said current steering circuit increasing current directed to said second driver when said first signal rises above a threshold voltage, said threshold voltage being above said supply voltage by a second offset voltage, wherein said first offset voltage is equal to said second offset voltage and a third offset voltage.

10. The circuit of claim 9, wherein said third offset voltage equals a gate to source voltage of an N channel transistor driven by said first signal.

11. The circuit of claim 9, wherein said second offset voltage is approximately 0.3 volts.

12. A circuit comprising:
    an inductive load;
    a first driver for providing a path for a first signal from said inductive load to a terminal for a supply voltage;
    a second driver for providing a path for said first signal from said inductive load to a terminal of ground;
    a current steering circuit for directing current to said first and second drivers to turn on said first and second drivers;
    said current steering circuit being driven by a second signal,
    said second signal having a first offset voltage with respect to said first signal;
    said current steering circuit increasing current directed to said first driver when said first signal falls below a threshold voltage to simultaneously turn on said first and second drivers, said threshold voltage being below said ground by a second offset voltage.

13. The circuit of claim 12, wherein said first driver is a P channel Field Effect Transistor (PPET).

14. The circuit of claim 12, wherein said second driver is an N channel Field Effect Transistor (NFET).

15. The circuit of claim 12, wherein said current steering circuit comprises a transistor pair to direct current to said first and second drivers, one transistor in said transistor pair being driven by said second signal.

16. The circuit of claim 12, wherein said current steering circuit comprises an NPN transistors pair to direct current to said first and second drivers, one of said NPN transistors being driven by said second signal.

17. The circuit of claim 12, wherein a High signal is asserted to activate said circuit when said first signal makes a transition from low to high.

18. A circuit comprising:
    an inductive load;
    a first driver for providing a path for a first signal from said inductive load to a terminal of a supply voltage;
    a second driver for providing a path for said first signal from said inductive load to a terminal of ground;
    a current steering circuit for directing current to said first and second drivers;
    said current steering circuit being driven by a second signal, said second signal having a first offset voltage with respect to said first signal;

said current steering circuit increasing current directed to said first driver when said first signal falls below a threshold voltage, said threshold voltage being below said ground by a second offset voltage, wherein said current steering circuit comprises an NPN transistor pair to direct current to said first and second drivers, one of said NPN transistor pair being driven by said second signal, wherein a collector current from each of said NPN transistor pair is mirrored by at least one current mirror such that when said first signal falls below said threshold voltage, said current mirror directs current to said first driver.

19. A circuit comprising:

an inductive load;

a first driver for providing a path for a first signal from said inductive load to a terminal for a supply voltage;

a second driver for providing a path for said first signal from said inductive load to a terminal of ground;

a current steering circuit for directing current to said first and second drivers;

said current steering circuit being driven by a second signal, said second signal having a first offset voltage with respect to said first signal;

said current steering circuit increasing current directed to said first driver when said first signal falls below a threshold voltage, and threshold voltage being below said ground by a second offset voltage, wherein said first offset voltage is equal to said second offset voltage and a third offset voltage.

20. The circuit of claim 19, wherein said third offset voltage equals a gate to source voltage of a P channel transistor driven by said first signal.

21. The circuit of claim 20, wherein said second offset voltage is approximately 0.3 volts.

22. The circuit of claim 21, wherein said supply voltage is equal to twelve volts.

* * * * *